(12) United States Patent
Han

(10) Patent No.: US 8,441,098 B2
(45) Date of Patent: May 14, 2013

(54) SEMICONDUCTOR PACKAGE

(75) Inventor: Kwon Whan Han, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 229 days.

(21) Appl. No.: 12/731,329

(22) Filed: Mar. 25, 2010

(65) Prior Publication Data

US 2011/0140237 A1 Jun. 16, 2011

(30) Foreign Application Priority Data

Dec. 10, 2009 (KR) ........................ 10-2009-0122307

(51) Int. Cl.
*H01L 23/52* (2006.01)
*H01L 23/538* (2006.01)
*H01L 23/48* (2006.01)

(52) U.S. Cl.
USPC ............ 257/532; 257/E23.174; 257/E23.011; 257/E23.141

(58) Field of Classification Search .................. 257/532, 257/724, 774, E23.074, E23.011, E23.141
See application file for complete search history.

(56) References Cited

U.S. PATENT DOCUMENTS

| 4,751,562 A * | 6/1988 | Yamamura ..................... 257/276 |
| 7,122,912 B2 * | 10/2006 | Matsui ........................... 257/797 |
| 7,129,567 B2 * | 10/2006 | Kirby et al. .................. 257/621 |
| 2007/0023888 A1 * | 2/2007 | Fujii ............................. 257/698 |

FOREIGN PATENT DOCUMENTS

| JP | 2003-168871 A | 6/2003 |
| JP | 2009-200189 A | 9/2009 |
| KR | 1020040030966 A | 4/2004 |
| KR | 1020060115284 A | 11/2006 |

* cited by examiner

*Primary Examiner* — Calvin Lee
*Assistant Examiner* — Monica D Harrison
(74) *Attorney, Agent, or Firm* — Ladas & Parry LLP

(57) ABSTRACT

A semiconductor package includes a semiconductor chip and a passive element. The semiconductor chip has a semiconductor chip body which possesses a first surface and a second surface facing away from the first surface, and a circuit section is formed in the semiconductor chip body. The passive element includes passive element bodies which are disposed in through-electrodes passing through the semiconductor chip body and connection members which are disposed on at least one of the first surface and the second surface of the semiconductor chip body and which electrically connect to at least one of the passive element bodies.

19 Claims, 10 Drawing Sheets

SEMICONDUCTOR PACKAGE

CROSS-REFERENCE TO RELATED APPLICATIONS

The present application claims priority to Korean patent application number 10-2009-0122307 filed on Dec. 10, 2009, which is incorporated herein by reference in its entirety.

BACKGROUND OF THE INVENTION

The present invention relates to a semiconductor package, and more particularly, to a semiconductor package which includes vertical passive elements.

These days, semiconductor packages with semiconductor chips capable of storing and processing a huge amount of data are being developed.

Semiconductor packages are mounted to a printed circuit board, or the like. In addition to the semiconductor packages, is passive elements such as capacitors and/or inductors are mounted to the printed circuit board, by which a system package is manufactured.

However, in the case where the semiconductor packages and the passive elements are mounted on the same plane of the printed circuit board so as to manufacture the system package, the area of the printed circuit board must be increased to accommodate all the components, and due to this fact, the size of the system package markedly increases.

BRIEF SUMMARY OF THE INVENTION

Embodiments of the present invention include a semiconductor package whose size is decreased by forming passive elements passing through a semiconductor chip.

In an embodiment of the present invention, a semiconductor package comprises a semiconductor chip having a semiconductor chip body which possesses a first surface and a second surface facing away from the first surface, and a circuit section which is formed in the semiconductor chip body; and a passive element having passive element bodies which are disposed in through-electrodes passing through the first surface and the second surface and one or more connection members which are disposed on at least one of the first surface and the second surface of the semiconductor chip body and electrically connect at least one of the passive element bodies.

The passive element bodies may comprise a first passive element body and a second passive element body which is disposed adjacent to the first passive element body and is insulated from the first passive element body; the connection members may comprise a first connection member which is electrically connected to the first passive element body and a second connection member which is electrically connected to the second passive element body; the first and second passive element bodies may serve as electrodes of capacitors; and the passive element bodies may be insulated from the circuit section.

The passive element bodies may include an insulation member which is filled in a through-hole defined between the first and second passive element bodies to expose the first and second passive element bodies.

The passive element bodies may have the shape of any one of a circular column or a plate.

The passive element bodies may be disposed in a peripheral region which is placed outside the circuit section.

The semiconductor package may further comprise a substrate on which the semiconductor chip is mounted, wherein the substrate may include a first pad which is connected to the first connection member and a second pad which is connected to the second connection member.

The connection members may be disposed on at least one of the first surface and the second surface of the semiconductor chip and serially connect a plurality of passive element bodies, thereby forming an inductor.

The respective passive element bodies may comprise metals having different electrical resistance.

The passive element bodies may have the shape of any one of a circular column or a plate.

The semiconductor package may further comprise a substrate on which the semiconductor chip is mounted, wherein the substrate may include pads which are electrically connected to the connection members.

The semiconductor package may further comprise a through-electrode passing through the semiconductor chip body which is formed with the passive element bodies, and electrically connected to the circuit section.

The passive element bodies may be disposed around the through-electrode, and the passive element bodies and the through-electrode may be electrically connected together.

The through-electrode and the passive element bodies may comprise metals having different electrical resistance.

At least two semiconductor chips each having the through-electrode and the passive element may be stacked, the passive element of an upper semiconductor chip may be electrically connected in series with the through-electrode of a lower semiconductor chip, and through-electrodes of the upper and lower semiconductor chips may be insulated from each other.

A plurality of passive element bodies may be disposed on the semiconductor chip body in the form of a matrix when viewed from the top.

Each connection members may comprise any one of a plate wiring line or a solder wiring line.

The semiconductor package may include at least one additional passive element body which is not electrically connected to the connection members.

The passive element bodies may be disposed perpendicularly with respect to the first surface and the second surface.

DESCRIPTION OF SPECIFIC EMBODIMENTS

Hereafter, specific embodiments of the present invention will be described in detail with reference to the accompanying drawings.

It is to be understood herein that the drawings are not is necessarily to scale and in some instances proportions may have been exaggerated in order to more clearly depict certain features of the invention.

Figure 1:
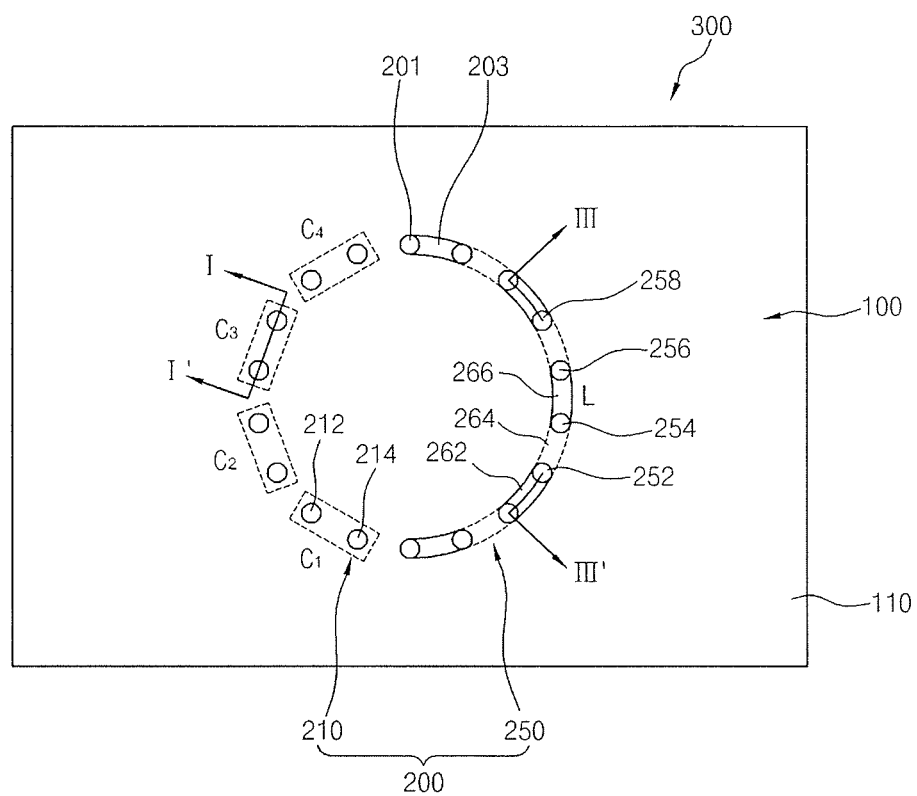
FIG. 1 is a plan view showing a semiconductor package in accordance with an embodiment of the present invention.
Figure 2:
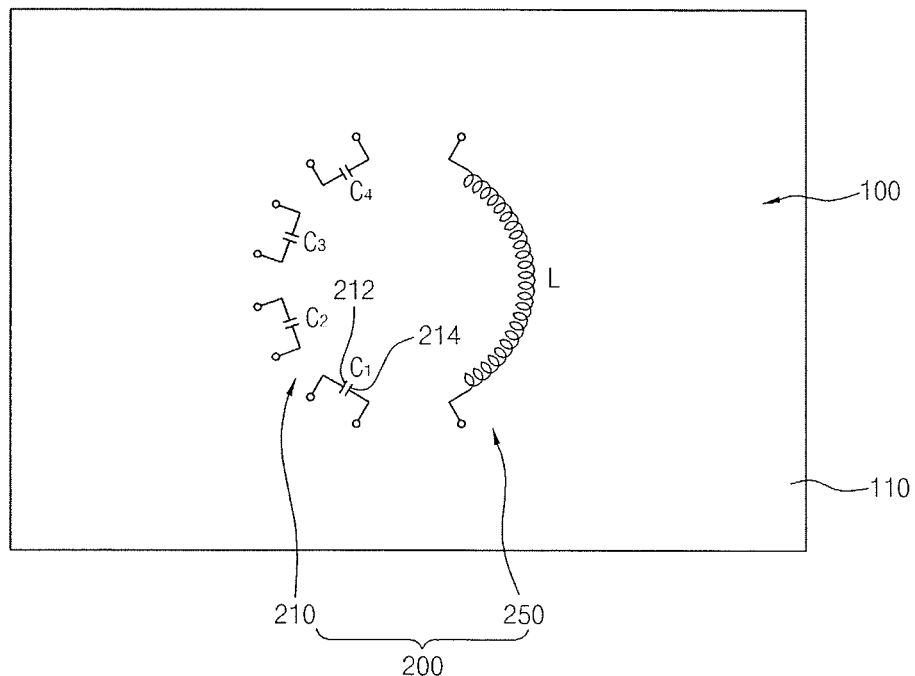
FIG. 2 is a circuit diagram showing circuits of passive elements shown in FIG. 1.
Figure 3:
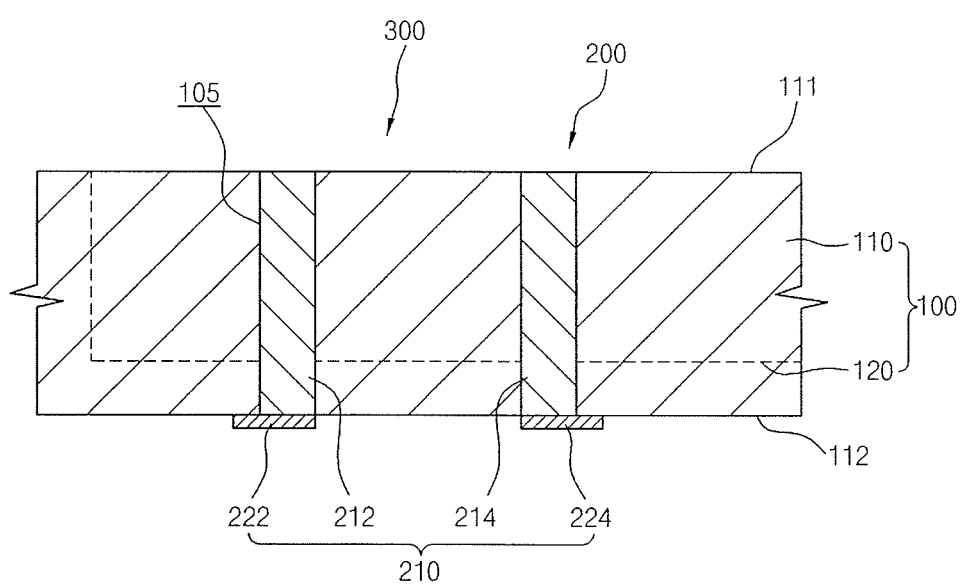
FIG. 3 is a cross-sectional view taken along the line I-I' of FIG. 1.

FIG. 1 is a plan view showing a semiconductor package in accordance with an embodiment of the present invention. FIG. 2 is a circuit diagram showing circuits of passive elements shown in FIG. 1. FIG. 3 is a cross-sectional view taken along the line I-I' of FIG. 1.

Referring to FIGS. 1 through 3, a semiconductor package 300 includes a semiconductor chip 100, and passive elements 200.

The semiconductor chip 100 includes a semiconductor chip body 110, and a circuit section 120.

The semiconductor chip body 110 has a plate-like shape. For example, the semiconductor chip body 110 has a rectangular hexahedral shape. The semiconductor chip body 110 having the plate-like shape possesses a first surface 111 and a second surface which faces away from the first surface 111. In an embodiment, the first surface 111 and the second surface 112 are parallel to each other.

The circuit section 120 is located in the semiconductor chip body 110. The circuit section 120 includes a data storage unit (not shown) for storing data and a data processing unit (not shown) for processing data.

The passive elements 200 pass through the semiconductor chip body 110 of the semiconductor chip 100. In an embodiment, the passive elements 200 are disposed substantially perpendicular to the first surface 111 or the second surface 112. In an embodiment, in the case where the passive elements 200 are formed to pass through the semiconductor chip body 110, the area that is occupied by the passive elements 200 can be significantly decreased, whereby the area of a system package or the like can be considerably decreased.

In an embodiment, each passive element 200 includes passive element bodies 201 and a connection member 203. The passive element bodies 201 are disposed in through-holes 105 which pass through the semiconductor chip body 110 extending from the first surface 111 to the second surface 112 of the semiconductor chip 100. In an embodiment, the through-holes 105 are defined to extend in a direction substantially perpendicular to the first surface 111 or the second surface 112. Therefore, the passive element bodies 201 are disposed perpendicularly with respect to the first surface 111 and the second surface 112 of the semiconductor chip body 110. The through-holes 105 may have various sectional shapes such as, for example, a circle, an ellipse, a quadrangle, a rectangle, etc. when viewed from the top.

The connection member 203 is electrically connected to their respective passive element bodies 201. In an embodiment, the connection member 203 may be electrically connected to one passive element body 201. Alternatively, the connection member 203 may be electrically connected to at least two passive element bodies 201. In an embodiment, the connection member 203 may comprise a plated wiring line or a solder wiring line.

Referring to FIGS. 1 and 3, the passive elements 200 can comprise, for example, capacitors C1, C2, C3 and C4. For each of the capacitors C1, C2, C3 and C4, two passive element bodies 212 and 214 serving as the electrodes are needed. In an embodiment, each of the capacitors C1, C2, C3 and C4 can include connection members 222 and 224. The pairs of passive element bodies 212 and 214 serving as the electrodes of the respective capacitors C1, C2, C3 and C4 are defined as a first passive element body 212 and a second passive element body 214.

The first passive element body 212 and the second passive element body 214 are separated from each other by a predetermined distance and are electrically insulated from each other. The individual first and second passive element bodies 212 and 214 have a sectional shape corresponding to that of the through-holes 105. The first and second passive element bodies 212 and 214 can comprise, for example, a plated layer formed through a plating process.

In an embodiment, the first passive element body 212 and the second passive element body 214 can include, for example, a conductive material. Examples of conductive material suitable for use as the first and second passive element bodies 212 and 214 include copper, silver, gold, and aluminum. Alternative types of conductive material can also be used as the first and second passive element bodies 212 and 214 including, for example, a dopant which is ion-implanted into the semiconductor chip body 110.

In an embodiment, an insulation layer can be interposed between the first passive element body 212 and the through-hole 105 in which it is formed and between the second passive element body 214 and the through-hole 105 in which it is formed so as to insulate the first and second passive element bodies 212 and 214 from the semiconductor chip body 110. The insulation layer can include an organic layer or an inorganic layer such as a silicon oxide layer.

The connection members 222 and 224 are defined as a first connection member 222 and a second connection member 224. The first connection member 222 can be disposed on the first surface 111 and/or the second surface 112 of the semiconductor chip body 110. The first connection member 222 is electrically connected to the first passive element body 212, and the second connection member 224 is electrically connected to the second passive element body 214. Voltages are respectively applied to the first connection member 222 and the second connection member 224 so that charges can be stored in the dielectric interposed between the first and second passive element bodies 212 and 214.

In an embodiment, the passive elements 200 formed to pass through the semiconductor chip 100 can be electrically connected to or insulated from the circuit section 120 of the semiconductor chip 100.

Figure 4:
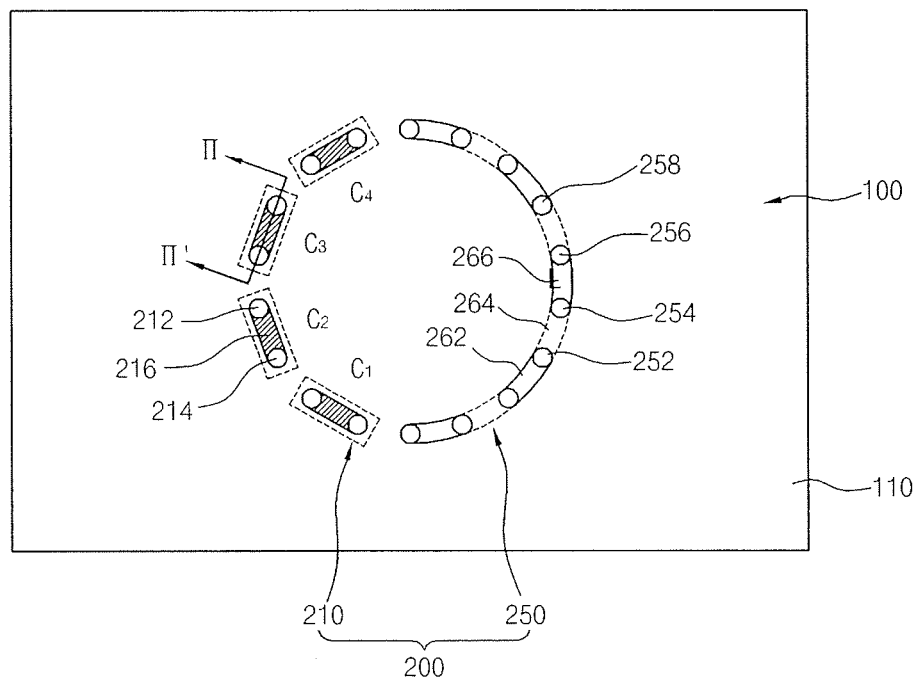
FIG. 4 is a plan view showing a semiconductor package in accordance with another embodiment of the present invention.
Figure 5:
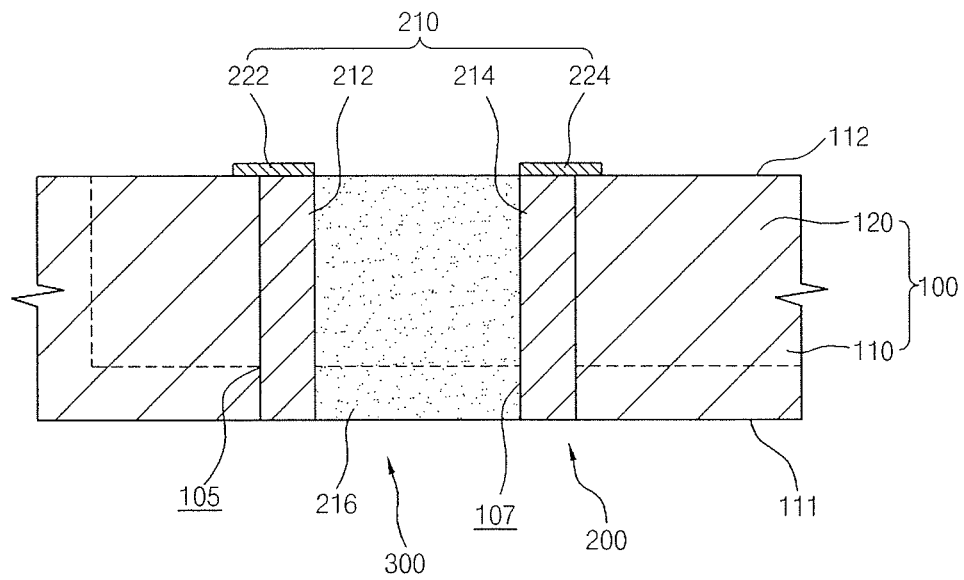
FIG. 5 is a cross-sectional view taken along the line II-II' of FIG. 4.

FIG. 4 is a plan view showing a semiconductor package in accordance with another embodiment of the present invention. FIG. 5 is a cross-sectional view taken along the line II-II' of FIG. 4. The semiconductor package shown in FIGS. 4 and 5 is similar to the semiconductor package described with respect to FIGS. 1 through 3, with the difference being the formation of a dielectric. Therefore, descriptions for the same component parts will be omitted herein, and the same technical terms and the same reference numerals will be used to refer to the same or like component parts.

Referring to FIGS. 4 and 5, in order to increase the capacitance of passive elements 200, a through-hole 107 is defined between a first passive element body 212 and a second passive element body 214. When defining the through-hole 107, opposing surfaces of the first passive element body 212 and the second passive element body 214 are exposed. Using the air existing in the through-hole 107 as a dielectric, the capacitance of the passive element 200, which in this case is a capacitor 210, can be further increased.

In an embodiment, by defining the through-hole 107 between the first passive element body 212 and the second passive element body 214 and then disposing a high-k dielectric (i.e., a highly dielectric material) in the through-hole 107, the capacitance of the passive element 200 including the capacitor 210 can be further increased.

In an embodiment, the capacitance of the passive element 200 including the capacitor 210 can be precisely controlled by adjusting the distance between the first passive element body 212 and the second passive element body 214.

Figure 6:
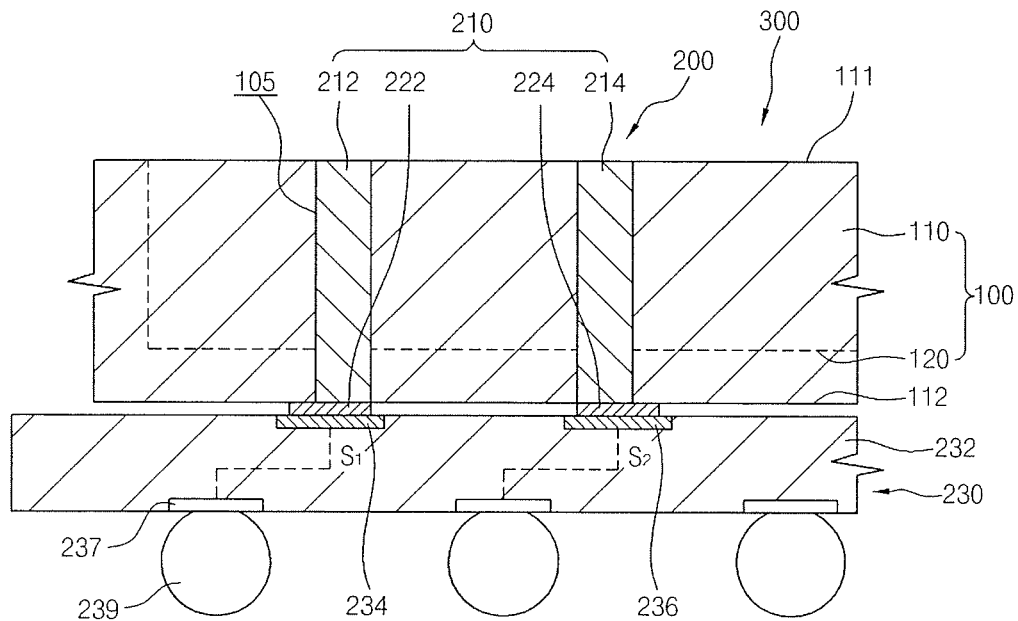
FIG. 6 is a cross-sectional view showing a semiconductor package in accordance with another embodiment of the present invention.

FIG. 6 is a cross-sectional view showing a semiconductor package in accordance with another embodiment of the present invention. The semiconductor package shown in FIG. 6 is similar to the semiconductor package described with respect to FIGS. 1 through 3, except the addition of a substrate. Therefore, descriptions for the same component parts will be omitted herein, and the same technical terms and the same reference numerals will be used to refer to the same or like component parts.

Referring to FIG. 6, a semiconductor package 300 includes a semiconductor chip 100, a passive element 200, and a substrate 230. The substrate 230 includes a substrate body 232, a first pad 234, a second pad 236, ball lands 237, and conductive balls 239.

The substrate body 232 has a plate-like shape, and the first pad 234 and the second pad 236 are disposed on the upper surface of the substrate body 232. The semiconductor chip 100 having first and second connection members 222 and 224 is placed on the upper surface of the substrate body 232.

The first pad 234 is disposed at a position allowing it to be electrically connected to the first connection member 222, and the second pad 236 is disposed at a position allowing it to be electrically connected to the second connection member 224. In an embodiment, the first pad 234 and the second pad 236 are aligned with the first connection member 222 and the second connection member 224, respectively. Therefore, the first pad 234 is electrically connected to the first connection member 222, and the second pad 236 is electrically connected to the second connection member 224.

The ball lands 237 are disposed on the lower surface of the substrate body 232, facing away from the upper surface. The ball lands 237 are electrically connected to the first and second pads 234 and 236. Voltages S1 and S2 are respectively applied to the first connection member 222 and the second connection member 224 to store charges between the first and second passive element bodies 212 and 214.

Figure 7:
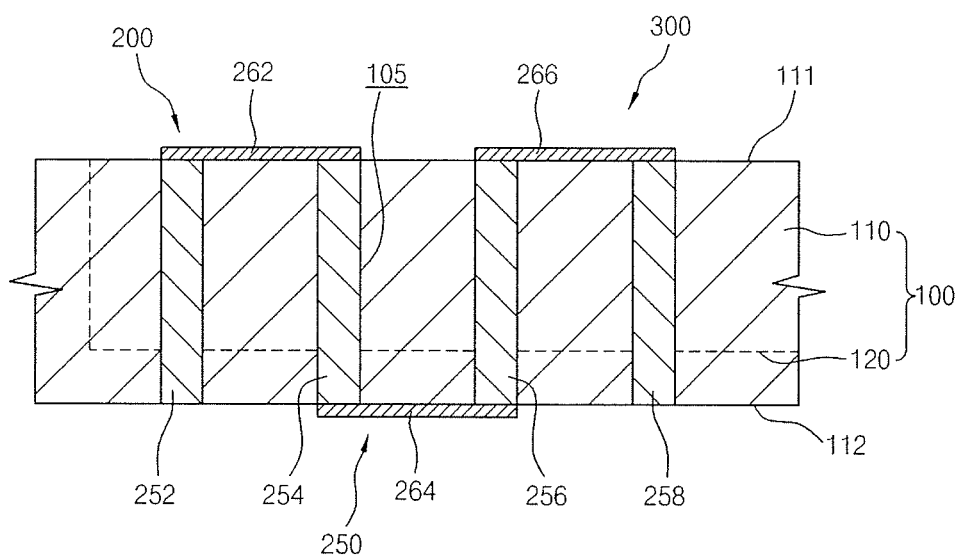
FIG. 7 is a cross-sectional view taken along the line of FIG. 1.

FIG. 7 is a cross-sectional view taken along the line of FIG. 1.

Referring to FIGS. 1 and 7, a passive element 200 may include, for example, an inductor L. The passive element 200 including the inductor L has one or more passive element bodies 252, 254, 256 and 258 and one or more connection members 262, 264 and 266.

Hereinbelow, the passive element bodies 252, 254, 256 and 258 are defined as a first passive element body 252, a second passive element body 254, a third passive element body 256, and a fourth passive element body 258.

The first through fourth passive element bodies 252, 254, 256 and 258 are disposed in through-holes 105 defined to pass through semiconductor chip body 110 from the first surface 111 to the second surface 112. The through-holes 105 may have various sectional shapes such as, for example, a circle, an ellipse, a quadrangle, a rectangle, etc. when viewed from the top. In an embodiment, the through-holes 105 are defined to be substantially perpendicular to the first surface 111 and/or the second surface 112. The first through fourth passive element bodies 252, 254, 256 and 258 may have, for example, the shape of a column such as a circular column or a plate-like shape.

The first through fourth passive element bodies 252, 254, 256 and 258 of the inductor L may include a conductive material. In an embodiment, the first through fourth passive element bodies 252, 254, 256 and 258 include a metal. Further, in an embodiment, the first through fourth passive element bodies 252, 254, 256 and 258 include the same metal. In an alternative embodiment, the first through fourth passive element bodies 252, 254, 256 and 258 include different metals in order to change the resistance of the inductor L. In an embodiment, the first through fourth passive element bodies 252, 254, 256 and 258 have the same electrical resistance. In an alternative embodiment, the first through fourth passive element bodies 252, 254, 256 and 258 have different electrical resistance.

The individual connection members 262, 264 and 266 are disposed on the first surface 111 or the second surface 112 of the semiconductor chip body 110. Hereinbelow, the connection members 262, 264 and 266 are defined as a first connection member 262, a second connection member 264, and a third connection member 266.

The first connection member 262 is disposed on the first surface 111 and electrically connects the first passive element body 252 to the second passive element body 254. The second connection member 264 is disposed on the second surface 112 and electrically connects the second passive element body 254 to the third passive element body 256. The third connection member 266 is disposed on the first surface 111 and electrically connects the third passive element body 256 to the fourth passive element body 258. As such, the individual first through third connection members 262, 264 and 266 are disposed on either the first surface 111 or the second surface 112 in such a way as to serially connect the first through fourth passive element bodies 252, 254, 256 and 258, so that the first through third connection members 262, 264 and 266 and the first through fourth passive element bodies 252, 254, 256 and 258 serve as the inductor L.

In an embodiment, the first through third connection members 262, 264 and 266 may include a metal. In an alternative embodiment, the first through third connection members 262, 264 and 266 may include a conductive polymer or a conductive tape. In an embodiment, the first through third connection members 262, 264 and 266 may include the same metal or different metals. In an embodiment, the first through third connection members 262, 264 and 266 may have the same electrical resistance or different electrical resistance.

While it was illustrated and explained that the first through third connection members 262, 264 and 266 are serially connected to the first through fourth passive element bodies 252, 254, 256 and 258, in should be understood that the first through third connection members 262, 264 and 266 may selectively not be connected to the first through fourth passive element bodies 252, 254, 256 and 258 depending upon the required resistance of the inductor L.

Figure 8:
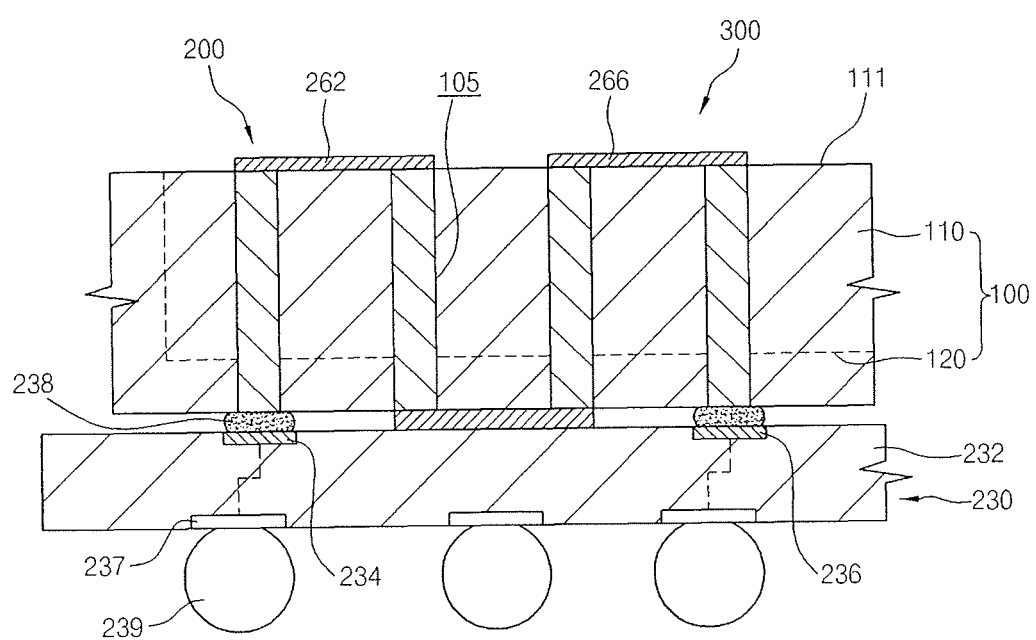
FIG. 8 is a cross-sectional view showing a semiconductor package in accordance with another embodiment of the present invention.

FIG. 8 is a cross-sectional view showing a semiconductor package in accordance with another embodiment of the present invention. The semiconductor package shown in FIG. 8 is similar to the semiconductor package described with respect to FIG. 7, except the addition a substrate. Therefore, descriptions for the same component parts will be omitted herein, and the same technical terms and the same reference numerals will be used to refer to the same or like component parts.

Referring to FIG. 8, a semiconductor package 300 includes a semiconductor chip 100, a passive element 200 as an inductor L, and a substrate 230. The substrate 230 includes a substrate body 232, a first pad 234, a second pad 236, ball lands 237, and conductive balls 239.

The substrate body 232 has a plate-like shape, and the first pad 234 and the second pad 236 are disposed on the upper surface of the substrate body 232. The semiconductor chip 100 having first through third connection members 262, 264 and 266 and first through fourth passive element bodies 252, 254, 256 and 258 is placed on the upper surface of the substrate body 232.

The first pad 234 is disposed at a position allowing it to be electrically connected to the first passive element body 252, and the second pad 236 is disposed at a position allowing it to be electrically connected to the fourth passive element body 258. In an embodiment, the first pad 234 and the second pad 236 are aligned with the first passive element body 252 and the fourth passive element body 258. In an embodiment, the first pad 234 is electrically connected to the first passive element body 252 by solder 238 or the like, and the second pad 236 is electrically connected to the fourth passive element body 258 by solder 238 or the like.

The ball lands 237 are disposed on the lower surface of the substrate body 232, facing away from the upper surface. The ball lands 237 are electrically connected to the first and second pads 234 and 236. Voltages are respectively applied to the first and second pads 234 and 236.

Figure 9:
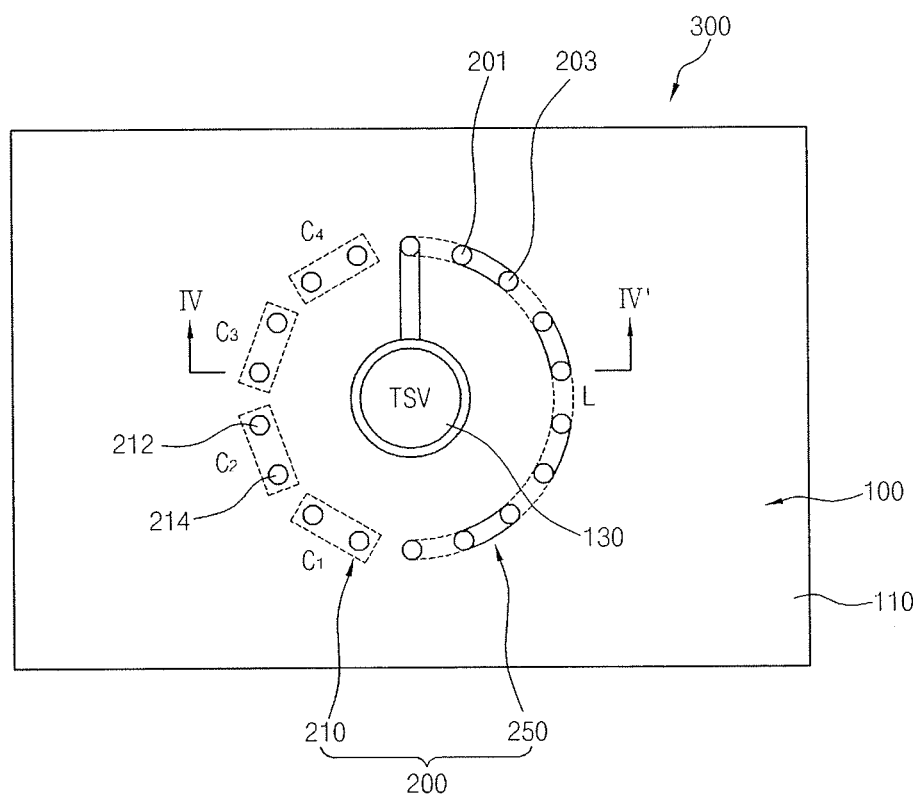
FIG. 9 is a plan view showing a semiconductor package in accordance with another embodiment of the present invention.
Figure 10:
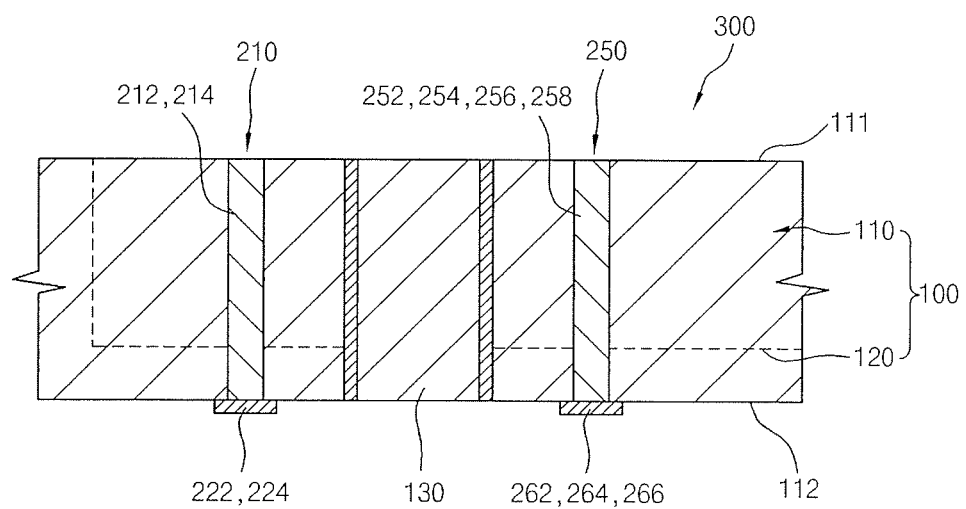
FIG. 10 is a cross-sectional view taken along the line IV-IV' of FIG. 9.

FIG. 9 is a plan view showing a semiconductor package in accordance with another embodiment of the present invention. FIG. 10 is a cross-sectional view taken along the line IV-IV' of FIG. 9.

Referring to FIGS. 9 and 10, a semiconductor package 300 includes a semiconductor chip 100 and passive elements 200. The semiconductor package shown in FIGS. 9 and 10 is similar to the semiconductor packages described with respect to FIGS. 1 through 8, except for formation of a through-electrode. Therefore, descriptions for the same component parts will be omitted herein, and the same technical terms and the same reference numerals will be used to refer to the same or like component parts.

The semiconductor chip 100 includes a semiconductor chip body 110, a circuit section 120, and a through-electrode 130. In an embodiment, the through-electrode 130 passes through the semiconductor chip body 110 extending from a first surface 111 to a second surface 112 of the semiconductor chip body 110. In an embodiment, the through-electrode 130 is electrically connected to the circuit section 120 of the semiconductor chip body 110. In an embodiment, the through-electrode 130 may include a first metal having a first resistance. For example, the first metal may include copper having a first resistance.

In an embodiment, an organic layer or an inorganic layer such as a silicon oxide layer may be interposed between the through-electrode 130 passing through the semiconductor chip body 110 and the semiconductor chip body 110.

The passive elements 200, for example, such as a capacitor 210 and/or an inductor 250, may be disposed around the through-electrode 130. The capacitor 210 as one of the passive elements 200 may include a pair of passive element bodies 212 and 214 and a pair of connection members 222 and 224 as shown in FIG. 3. The inductor 250 as one of the passive elements 200 may include a plurality of passive element bodies 252, 254, 256 and 258 and a plurality of connection members 262, 264 and 266 as shown in FIG. 7.

In an embodiment, the through-electrode 130 and one or more of the passive elements 200 are electrically connected to each other. Alternatively, the through-electrode 130 may be electrically insulated from each of the passive elements 200.

In an embodiment, the passive elements 200 may include a first metal having the first resistance, in the same manner as in the through-electrode 130. In the case where the passive elements 200 and the through-electrode 130 include the first metal having the first resistance, the through-electrode 130 and the passive elements 200 are formed simultaneously during the same manufacturing processes.

In an alternative embodiment, the passive elements 200 may include a second metal having a second resistance different from the first metal having the first resistance of the through-electrode 130. In an embodiment, and in the case where the through-electrode 130 includes the first metal having the first resistance and the passive elements 200 include the second metal having the second resistance, the through-electrode 130 and the passive elements 200 are formed through different manufacturing processes. In an embodiment, the passive elements 200 may include, for example, any of copper, gold, silver, aluminum, etc. or any of copper, gold, silver, aluminum, etc. mixed with impurities.

Figure 11:
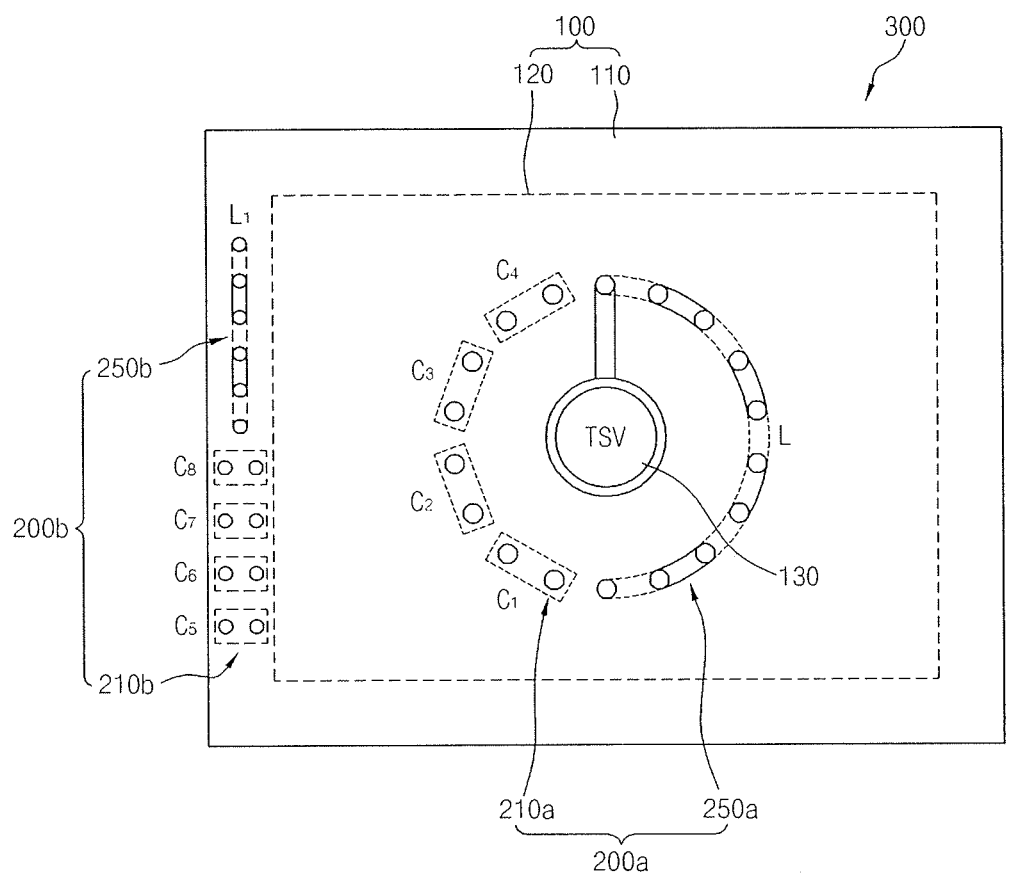
FIG. 11 is a plan view showing a semiconductor package in accordance with another embodiment of the present invention.

FIG. 11 is a plan view showing a semiconductor package in accordance with another embodiment of the present invention. The semiconductor package shown in FIG. 11 is similar to the semiconductor package described with respect to FIG. 1, except arrangement of passive elements. Therefore, descriptions for the same component parts will be omitted herein, and the same technical terms and the same reference numerals will be used to refer to the same or like component parts.

Referring to FIG. 11, a semiconductor package 300 includes a semiconductor chip 100, and passive elements 200a and 200b. The passive elements 200a and 200b include first passive elements 200a and second passive elements 200b.

The first passive elements 200a are disposed in a circuit section 120 of a semiconductor chip body 110. The first passive elements 200a include, for example, a capacitor 210a and an inductor 250a which pass through the semiconductor chip body 110. The capacitor 210a and the inductor 250a of the first passive elements 200a may have the same structures as the capacitor 210 and the inductor 250 shown in FIGS. 3 and 7 respectively.

The second passive elements 200b are disposed outside the circuit section 120 of the semiconductor chip body 110. The second passive elements 200b include, for example, a capacitor 210b and an inductor 250b which pass through the semiconductor chip body 110. The capacitor 210b and the inductor 250b of the second passive elements 200b may have the same structures as the capacitor 210 and the inductor 250 shown in FIGS. 3 and 7 respectively.

Figure 12:
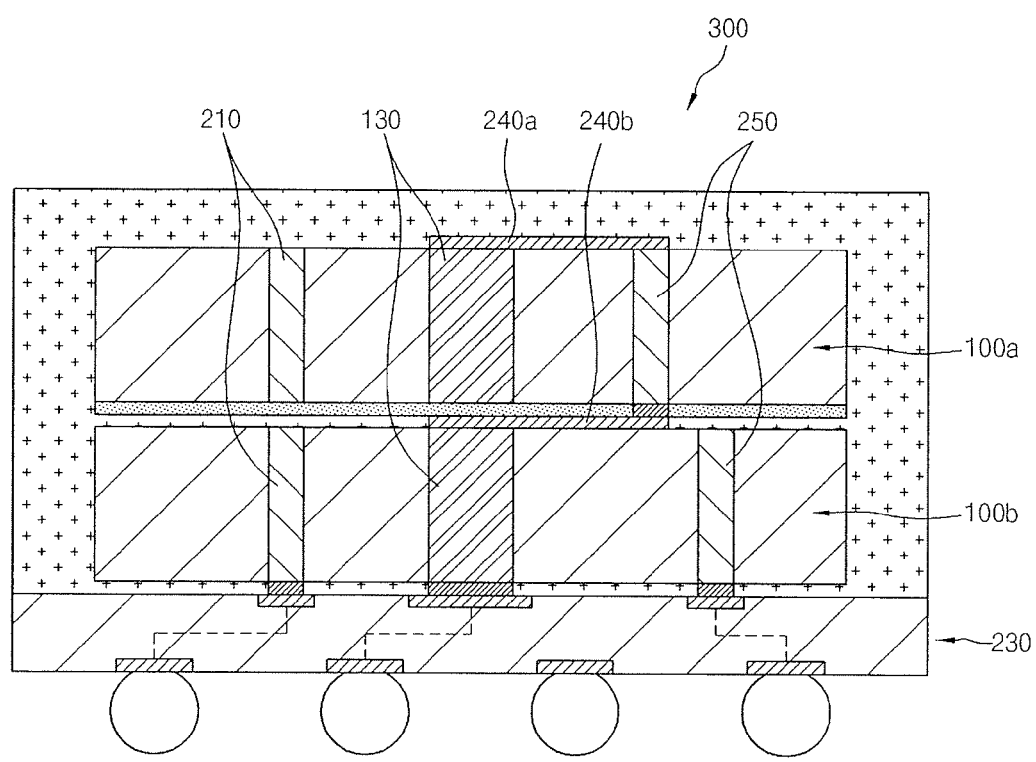
FIG. 12 is a cross-sectional view showing a semiconductor package in accordance with another embodiment of the present invention.

FIG. 12 is a cross-sectional view showing a semiconductor package in accordance with another embodiment of the present invention. The semiconductor package shown in FIG. 12 includes component parts similar to the semiconductor package described with respect to FIG. 9, except for the arrangement of multiple semiconductor chips and a substrate. Therefore, descriptions for the same component parts will be omitted herein, and the same technical terms and the same reference numerals will be used to refer to the same or like component parts.

Referring to FIG. 12, a semiconductor package 300 includes an upper semiconductor chip 100a, a lower semiconductor chip 100b, and a substrate 230.

The upper semiconductor chip 100a and the lower semiconductor chip 100b may have substantially the same construction as the semiconductor chip 100 shown in FIG. 9. The upper semiconductor chip 100a and the lower semiconductor chip 100b are stacked on the substrate 230.

In an embodiment, a through-electrode 130 of the upper semiconductor chip 100a is electrically connected to a passive element 250 of the upper semiconductor chip 100a by means of an upper connection pattern 240a, and the passive element 250 of the upper semiconductor chip 100a is electrically connected to a through-electrode 130 of the lower semiconductor chip 100b by means of a lower connection pattern 240b.

The upper semiconductor chip 100a and the lower semiconductor chip 100b are stacked on the substrate 230, and the through-electrode 130 and the passive elements 210 and 250 of the lower semiconductor chip 100b are electrically connected to the substrate 230.

Figure 13:
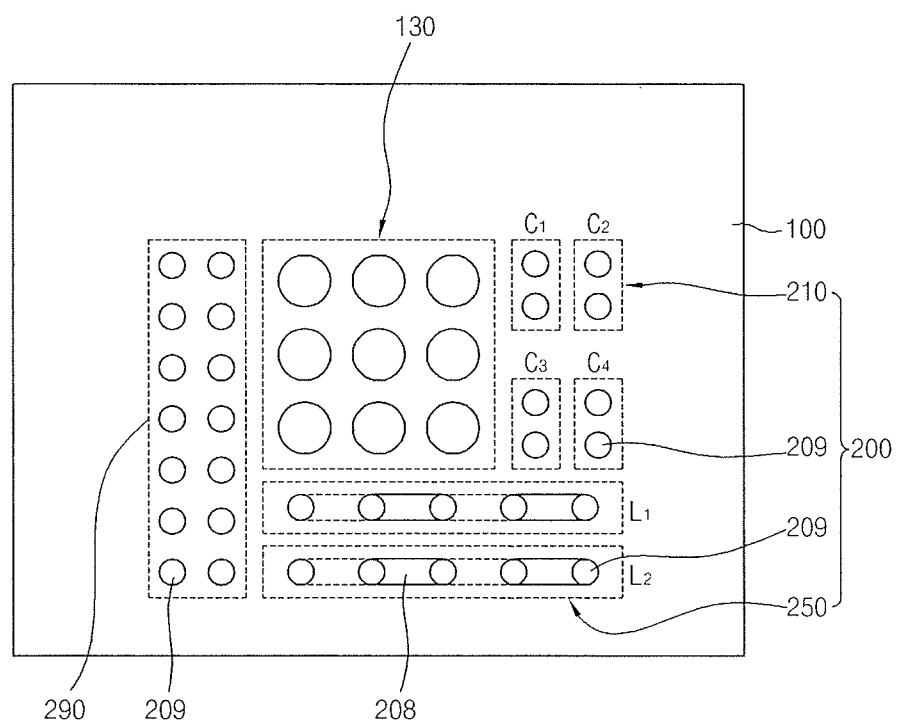
FIG. 13 is a plan view showing a semiconductor package in accordance with another embodiment of the present invention.

FIG. 13 is a plan view showing a semiconductor package in accordance with another embodiment of the present invention. The semiconductor package shown in FIG. 13 is similar to the semiconductor package described with respect to FIG. 9, except the arrangement of elements. Therefore, descriptions for the same component parts will be omitted herein, and the same technical terms and the same reference numerals will be used to refer to the same or like component parts.

Referring to FIG. 13, a semiconductor package 300 includes a semiconductor chip 100, passive elements 200, and additional passive elements 290.

The semiconductor chip 100 includes through-electrodes 130. In an embodiment, a plurality of the through-electrodes 130 can be disposed in the form of a matrix.

A plurality of passive element bodies 209, which pass through the semiconductor chip 100 and constitute the passive elements 200, are disposed in the form of a matrix when viewed from the top. By disposing the passive element bodies 209 constituting the passive elements 200 in the form of a matrix and selectively electrically connecting the desired passive element bodies 209 using connection members 208, capacitors C1, C2, C3 and C4: 240 or inductors L1 and L2: 250 can be formed as shown in FIG. 13.

A plurality of additional passive elements 290 are disposed on the semiconductor chip 100 in the form of a matrix. When passive elements are additionally needed afterwards, a required number of the additional passive elements 290 can be electrically connected using the connection members 208.

As is apparent from the above description, the present invention provides advantages in that, since capacitors and an inductor are formed in a semiconductor chip by defining through-holes to pass through the semiconductor chip and by forming conductive patterns or electrodes in the through-holes to realize passive elements, the overall volume and thickness of a semiconductor package can be significantly reduced. Also, by forming the capacitors and the inductor along with through-electrodes, the number of manufacturing processes and the manufacturing cost can be remarkably decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a semiconductor chip having a semiconductor chip body which possesses a first surface and a second surface facing away from the first surface, the semiconductor chip including a circuit section formed in the semiconductor chip body; and
   a passive element having two or more passive element bodies each disposed in through-holes passing through the semiconductor chip body, and the passive element having one or more connection members disposed on at least one of the first surface and the second surface of the semiconductor chip body, the one or more connection members connecting the two or more passive element bodies.

2. The semiconductor package according to claim 1,
   wherein the two or more passive element bodies comprise a first passive element body formed in the semiconductor chip body of the semiconductor chip and a second passive element body which is disposed adjacent to the first passive element body in the semiconductor chip body of the semiconductor chip and is insulated from the first passive element body;
   wherein the connection members comprise a first connection member electrically connected to the first passive element body and a second connection member electrically connected to the second passive element body;
   wherein the first and second passive element bodies serve as electrodes of a capacitor; and
   wherein the two or more passive element bodies are insulated from the circuit section.

3. The semiconductor package according to claim 2, wherein the two or more passive element bodies further comprise an insulation member filled in a through-hole, the through-hole being defined between the first and second passive element bodies so as to expose the first and second passive element bodies.

4. The semiconductor package according to claim 2, wherein the two or more passive element bodies have the shape of any one of a circular column and a plate.

5. The semiconductor package according to claim 2, wherein the two or more passive element bodies are disposed in a peripheral region located outside the circuit section.

6. The semiconductor package according to claim 2, further comprising:
   a substrate on which the semiconductor chip is mounted, wherein the substrate comprises a first pad connected to the first connection member and a second pad connected to the second connection member.

7. The semiconductor package according to claim 1, wherein the one or more connection members are disposed on at least one of the first surface and the second surface of the semiconductor chip so as to serially connect a plurality of the passive element bodies, thereby forming an inductor.

8. The semiconductor package according to claim 7, wherein the respective passive element bodies comprise metals having different electrical resistance.

9. The semiconductor package according to claim 7, wherein the two or more passive element bodies have the shape of any one of a circular column and a plate.

10. The semiconductor package according to claim 7, further comprising:
    a substrate on which the semiconductor chip is mounted, wherein the substrate includes pads electrically connected to the connection members.

11. The semiconductor package according to claim 1,
wherein the through-electrode passing through the semiconductor chip body which is formed with the two or more passive element bodies passing therethrough, and electrically connected to the circuit section.

12. The semiconductor package according to claim 11, wherein the two or more passive element bodies are disposed around the through-electrode, and the passive element bodies and the through-electrode are electrically connected together.

13. The semiconductor package according to claim 11, wherein the through-electrode and the two or more passive element bodies comprise metals having different electrical resistance.

14. The semiconductor package according to claim 11, wherein at least two of the semiconductor chips each having the through-electrode and the passive element are stacked, and the passive element of an upper semiconductor chip of the at least two semiconductor chips is electrically connected to the through-electrode of a lower semiconductor chip of the at least two semiconductor chips, and the through-electrodes of the upper and lower semiconductor chips are insulated from each other.

15. The semiconductor package according to claim 1, wherein the two or more passive element bodies are disposed on the semiconductor chip body in the form of a matrix when viewed from the top.

16. The semiconductor package according to claim 1, wherein each of the one or more connection members comprises any one of a plate wiring line or a solder wiring line.

17. The semiconductor package according to claim 1, further comprising:
at least one additional passive element body which is not electrically connected to the connection members.

18. The semiconductor package according to claim 1, wherein the two or more passive element bodies are disposed perpendicularly with respect to the first surface and the second surface of the semiconductor chip body.

19. The semiconductor package according to claim 1, comprising a plurality of the passive elements, wherein the passive element bodies of a first passive element of the plurality of passive elements pass through the circuit section, and the passive element bodies of a second passive element of the plurality of passive elements are disposed in a peripheral region located outside the circuit section.

* * * * *